United States Patent
Kim et al.

(10) Patent No.: US 11,395,080 B2
(45) Date of Patent: Jul. 19, 2022

(54) SYSTEMS AND METHODS FOR ACCESSORY AND IMPEDANCE DETECTION

(71) Applicant: Maxim Integrated Products, Inc., San Jose, CA (US)

(72) Inventors: Sang Hoon Kim, Glenview, IL (US); Giuseppe Patti, Catania (IT)

(73) Assignee: Maxim Integrated Products, Inc., San Jose, CA (US)

( * ) Notice: Subject to any disclaimer, the term of this patent is extended or adjusted under 35 U.S.C. 154(b) by 478 days.

(21) Appl. No.: 16/168,561

(22) Filed: Oct. 23, 2018

(65) Prior Publication Data
US 2019/0124457 A1    Apr. 25, 2019

Related U.S. Application Data

(60) Provisional application No. 62/575,982, filed on Oct. 23, 2017.

(51) Int. Cl.
*H04R 29/00* (2006.01)
*G01R 19/175* (2006.01)
(Continued)

(52) U.S. Cl.
CPC ......... *H04R 29/001* (2013.01); *G01R 19/175* (2013.01); *G01R 27/16* (2013.01);
(Continued)

(58) Field of Classification Search
CPC ............... H04R 29/001; H04R 1/1041; H04R 2420/05; G01R 19/175; G01R 27/16;
(Continued)

(56) References Cited

U.S. PATENT DOCUMENTS

2012/0019309 A1   1/2012  Turner et al.
2012/0237044 A1*  9/2012  Poulsen ............... H04R 1/1041
                                                            381/58
(Continued)

FOREIGN PATENT DOCUMENTS

CN    102480563 A    5/2012
CN    102638743 A    8/2012

OTHER PUBLICATIONS

First office action dated Mar. 1, 2021 in related Chinese patent application No. 201811234256.3, (23 pgs).
(Continued)

*Primary Examiner* — Douglas X Rodriguez
*Assistant Examiner* — Trung Q Nguyen
(74) *Attorney, Agent, or Firm* — North Weber & Baugh LLP; Michael V. North

(57) ABSTRACT

Described herein are systems and methods for reliably detecting of the presence or absence of accessories and other components connected to an external electrical device or connector. A low-cost detection circuit reliably distinguishes
(Continued)

between a compromised connector and the presence of an actual device, thereby, preventing false detection scenarios. In various embodiments, the detection circuit accomplishes this by using a zero-crossing detector and/or a digital signal, which serves as a measure of impedance, to detect, within an identification period, the presence of the external device.

20 Claims, 5 Drawing Sheets

(51) Int. Cl.
    *G01R 27/16*     (2006.01)
    *H04R 1/10*     (2006.01)
    *H04M 1/60*     (2006.01)

(52) U.S. Cl.
    CPC ......... *H04R 1/1041* (2013.01); *H04M 1/6058* (2013.01); *H04R 2420/05* (2013.01)

(58) Field of Classification Search
    CPC ........ G01R 31/44; G01R 25/04; G01R 27/26; G01R 27/02; H04M 1/6058
    USPC .......... 324/500, 538, 514, 525, 756.05, 600, 324/694, 754.04–754.15, 452–453, 200, 324/204

See application file for complete search history.

(56) References Cited

U.S. PATENT DOCUMENTS

| | | |
|---|---|---|
| 2013/0070930 A1 | 3/2013 | Johnson |
| 2014/0003616 A1 | 1/2014 | Johnson et al. |
| 2014/0038460 A1 | 2/2014 | Lee et al. |
| 2014/0084687 A1* | 3/2014 | Dent ..................... H02J 7/0068 307/26 |
| 2014/0241535 A1 | 8/2014 | Poulsen et al. |
| 2015/0326970 A1 | 11/2015 | Miske et al. |
| 2015/0333458 A1 | 11/2015 | Hallsten et al. |
| 2017/0272877 A1* | 9/2017 | Roh ..................... H04R 29/001 |

OTHER PUBLICATIONS

Chinese office action 2 dated Nov. 3, 2021 in related Chinese patent application No. 201811234256.3, (11 pgs).
Chinese office action 2 response filed Jan. 18, 2022 in related Chinese patent application No. 201811234256.3, (13 pgs).

* cited by examiner

SYSTEMS AND METHODS FOR ACCESSORY AND IMPEDANCE DETECTION

CROSS REFERENCE TO RELATED PATENT APPLICATIONS

The present application claims priority benefit, under 35 U.S.C. § 119(e), to commonly-assigned U.S. Provisional Patent Application No. 62/575,982, entitled "SYSTEMS AND METHODS FOR ACCESSORY AND IMPEDANCE DETECTION," naming as inventors Sang Hoon Kim and Giuseppe Patti, and filed Oct. 23, 2017, which application is herein incorporated by reference as to its entire content. Each reference mentioned in this patent document is herein incorporated by reference in its entirety and for all purposes.

BACKGROUND

A. Technical Field

The present disclosure relates to electronic detection circuits. More particularly, the present disclosure is related to systems and methods for reliably detecting of the presence or absence of accessories and other components connected to a device.

B. Description of the Related Art

Numerous consumer electronic devices, such as some smartphones, utilize impedance detection circuitry to detect whether a counterpart device, such as headphone accessory, is attached to or has been removed from the electronic device. A relatively low measured impedance, i.e., the equivalent to a short circuit condition, e.g., at a common communication interface between the devices, serves as an indicator indicates that the counterpart device or accessory is present, whereas a relatively high impedance, i.e., the equivalent to an open circuit condition, is used to conclude that the accessory is absent.

In existing designs, oftentimes, a single predefined impedance value serves as decision point that determines what is considered high and low impedance. However, if, a connector, for example, is contaminated, e.g., through the intrusion of water into the connector, this may cause a significant reduction in the to-be-measured impedance level. As a result, the relatively lower impedance may then be falsely interpreted as an device or accessory being present when, in fact, the accessory has been removed. In other words, a sufficiently low impedance reading caused by moisture is likely to lead to an erroneous conclusion about an attachment condition.

Currently, there exist no simple, low-cost systems or methods that can reliably distinguish between a contaminated connector and the presence of an actual device so as to prevent false detection scenarios. Some approaches use a ground detection circuit to monitor a ground contact in addition to a monitoring an audio contact (e.g., an additional left audio contact). However, monitoring the extra ground contact involves increased complexity and a space requirement that comes at a premium, especially, in portable devices.

In addition, such designs frequently require non-conventional connectors that unnecessarily increase overall cost, e.g., due to additional tooling requirements, etc. Nevertheless, when moisture is trapped inside the connector, this still causes both the extra ground contact and the audio contact to electrically appear as a low impedance path to ground, such that false readings are not prevented in these scenarios.

Accordingly, what is needed are systems and methods that overcome the shortcomings of existing designs and provide reliable alternatives.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. Items in the figures are not to scale.

DETAILED DESCRIPTION OF EMBODIMENTS

Figure 1:
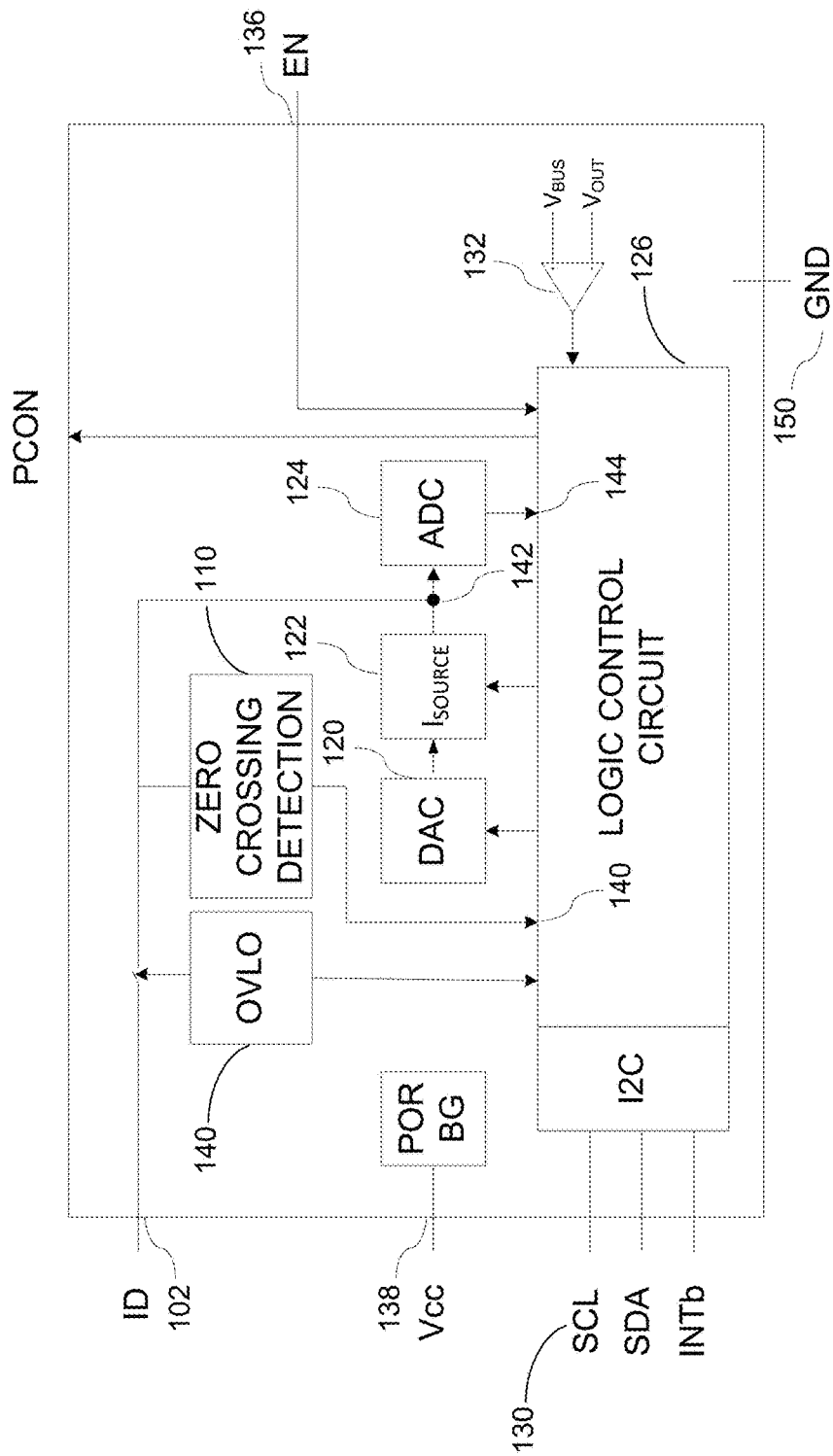
FIG. 1 illustrates and exemplary detection circuit according to embodiments of the present document.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

The terms "include," "including," "comprise," and "comprising" shall be understood to be open terms and any lists the follow are examples and not meant to be limited to the listed items. Any headings used herein are for organizational purposes only and shall not be used to limit the scope of the description or the claims. Each reference mentioned in this patent document is incorporate by reference herein in its entirety.

Furthermore, one skilled in the art shall recognize that: (1) certain steps may optionally be performed; (2) steps may not be limited to the specific order set forth herein; (3) certain steps may be performed in different orders; and (4) certain steps may be done concurrently.

Furthermore, it shall be noted that embodiments described herein are given in the context of audio connectors coupled to detection circuits that utilize analog audio signals, but one skilled in the art shall recognize that the teachings of the present disclosure are not limited such applications and may equally be implemented into other contexts that are unrelated to audio connectors and audio signals. For example, a detection circuit according to the present invention may detect the presence of any other type of device, e.g., a TRRS headset.

In this document the terms "socket" and "plug" are used interchangeably. Similarly, the terms "jack" and "connector" are used interchangeably.

FIG. 1 illustrates and exemplary detection circuit according to embodiments of the present document. As depicted in FIG. 1, detection circuit 100 comprises zero-crossing detector 110, current source 122, ADC 124, logic control circuit 126, and protection circuitry 140. Detection circuit 100 may be implemented, for example, in a portable device.

Zero-crossing detector 110 may be any zero-crossing detector known in the art, such as a programmable hysteresis detector or (analog) comparator that indicates, e.g., whether a voltage signal has crossed a certain voltage level. In embodiments, zero-crossing detector 110 may be coupled to both current source 122 and ADC 124.

Logic control circuit 126 may be coupled to any component within system 100. It is noted that the logic control circuit illustrated in FIG. 1 is not limited to the implementation details shown there or described in the accompanying text, e.g., the use of an I²C bus and its accompanying connections 130. One skilled in the art will appreciate that any suitable communication methods and signals may be used to accomplish the objectives of the present invention.

In operation, in embodiments, detection circuit 100 uses current source 122, e.g., a programmable constant-current source, to generate a current that is injected into node 142, e.g., via a pin (not shown in FIG. 1) designed to couple detection circuit 100 to an external device (not shown), e.g., via the interface labeled "ID" in FIG. 1.

The current that is impressed at node 142 gives rise to a voltage at node 142 depending on the impedance present at the pin. Therefore, the voltage at node 142, e.g., an analog voltage signal, is representative of an impedance between, e.g., the external device such as a receptacle connector, and a reference potential, such as ground potential 150. In embodiments, current source 122 may be substituted, for example, with a test signal generator that generates a test signal, e.g., an analog voltage signal.

In embodiments, ADC 124 outputs digital signal 144 based on the current and/or voltage at node 142. For example, ADC 124 may measure an analog voltage input signal 102, to output signal 144 that represents a digital conversion of the analog voltage and, thus, represents the impedance between the external device and the reference potential. It is understood that digital signal 144 may be determined using any method known in the art, such as measuring averaged values or using peak detection, and may be stored, e.g., in logic control circuit 126.

In embodiments, detection circuit 100 uses digital signal 144 as a measure of an impedance in order to detect, within a certain time period, the presence of the external device. In embodiments, programmable current source 122 and ADC 124 ensure that detection circuit 100 can accurately detect a wide range of impedances. Once detection circuit 100 completes a measurement to perform a detection, the value of signal 144 may be reset for a measurement in a subsequent time period.

In embodiments, zero-crossing detector 110 utilizes current 142 to determine, within an identification period, whether voltage signal 102 satisfies a zero-crossing condition. In response to detecting a zero-crossing condition, zero-crossing detector 110 then outputs zero-crossing signal 140 that indicates whether voltage signal 102 has crossed a certain threshold. The threshold may be used to draw a conclusion about the impedance at node 142 and, thus, the desired attachment condition.

In embodiments, logic control circuit 126 is configured to draw the conclusion by utilizing a state machine or microprocessor based on the detected device detection threshold. In embodiments, state machine/microprocessor uses signal 130, e.g., a serial clock signal (SCL), a serial data signal (SDA), or an interrupt signal (INTb) to determine the attachment condition.

In embodiments, logic control circuit 126 and/or a processor coupled to detection circuit 100 may be used to set a time period for an identification interval. Logic control circuit 126 may be designed to program the identification interval in which detection circuit 100 performs zero-crossing and/or impedance detection. In embodiments, based on at least zero-crossing signal 140 and/or voltage 142/144, logic control circuit 126 or the processor determines a condition that is representative of the presence of a device or the presence of a contamination, e.g., the presence of humidity in a connector, as will be described with reference to FIG. 2.

In embodiments, logic control circuit 126 or the processor may use digital signal 144 and the current at node 142 to determine an impedance value that then may be used to determine the presence of a device and/or the contamination.

Figure 2:
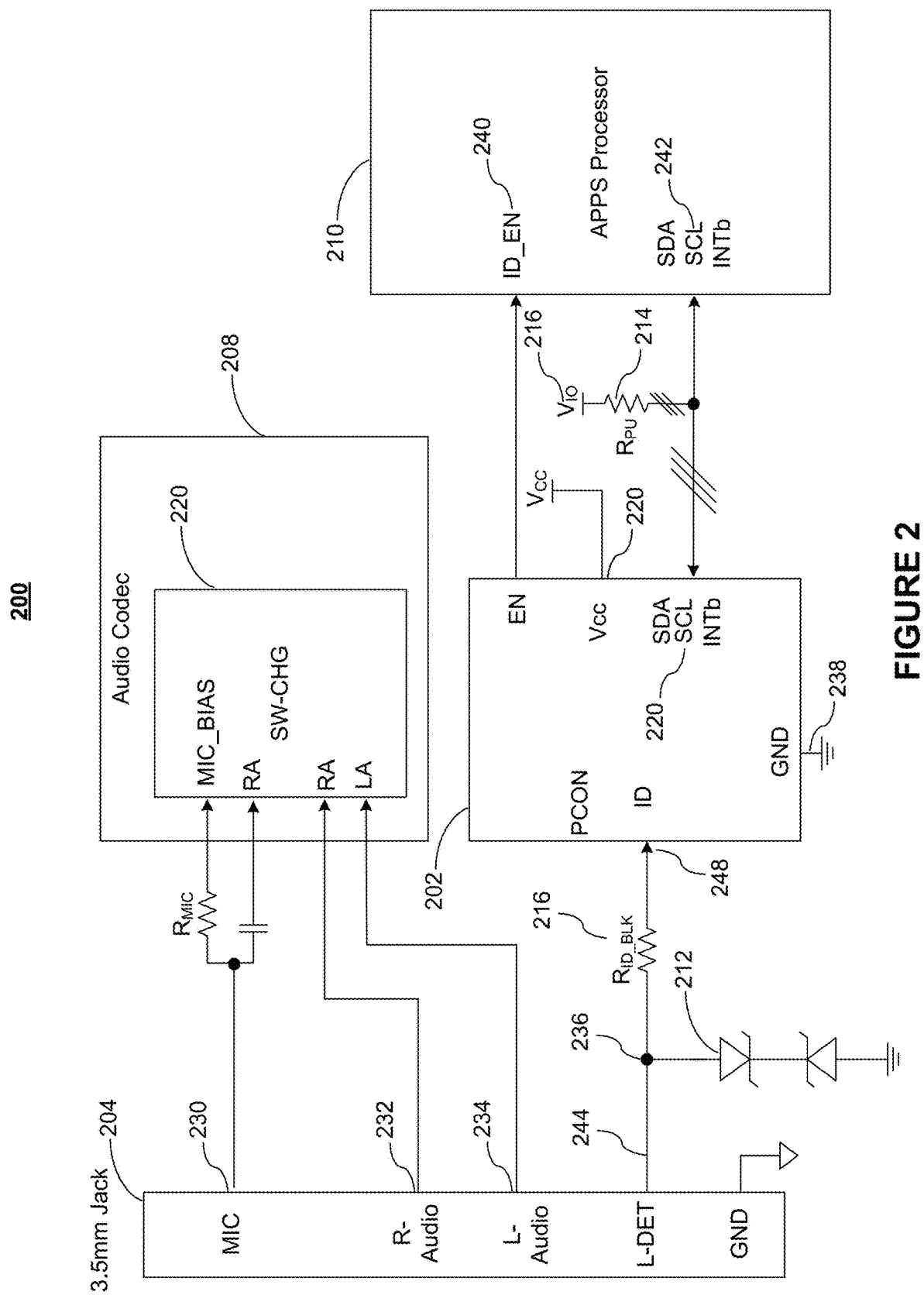
FIG. 2 illustrates an exemplary detection system according to embodiments of the present document.

FIG. 2 illustrates and exemplary detection system according to embodiments of the present document. System 200 comprises detection circuit 202, connector 204, audio codec 208, processor 210, protection circuit 212, 216, and pull-up resistor 214. Connector 204 in FIG. 2 may be a 3.5 mm audio socket. However, the type, dimensions, etc., recited herein are not intended as a limitation on the scope of the invention. In addition, connector 204 may be used for any type of device or accessory, e.g., a headphone.

In embodiments, when connector 204 is disconnected from detection circuit 202, detection circuit 202 injects a current into node 236 and measures a relatively high voltage at interface 248 from which a relatively high impedance is predicted. As mentioned in the Background section, a relatively low impedance indicates the presence of a connector, whereas a relatively high impedance indicates an open circuit condition, i.e., the absence of connector 204. Therefore, based on a relationship between the measured signal at interface 248 and a detection threshold, it can be determined whether connector 204 is, in fact, present.

However, the presence of an external signal, such as a bipolar audio signal level at connector 204 that exceeds a device detection signal level (e.g., a voltage measuring range of detection circuit 202) may prevent accurate signal detection and may cause a false reading that erroneously indicates the removal or absence of connector 204.

In addition, in contrast to existing designs, that typically utilize a relatively high device detection threshold, since an open circuit has ideally infinite impedance, embodiments of the present invention, may utilize a relatively lower detection threshold to ensure that a relatively lower impedance caused by the presence of a contamination in connector 204 will not be misinterpreted and result in a false conclusion that a connector 204 is present when, in fact, no device is connected to system 200.

In embodiments, once connector 204 is mechanically connected to the socket of a device, contacts, e.g., metal rings on connector 204, such as contacts 232 (right audio), 234 (left audio), and 244 (L-DET), may be electrically shorted together. In embodiments, the electrical connection may then be detected by injecting a current, e.g., into the L-DET pin and measuring the voltage (e.g., a few µV) at the pin. The voltage may then be used to determine an impedance (e.g., 16Ω) and an attachment condition, e.g., by comparing the obtained voltage to a threshold, as previously discussed.

Audio codec 208 comprises ports for receiving signals, such as a microphone bias signal and audio signals that may be encoded or decoded. It is understood that any type of connection may be utilized, e.g., a multi-conductor multi-pin connector. As mentioned with reference to FIG. 1, system 200 in FIG. 2 is not limited to the implementation details shown or described here that enable the present disclose. For example, the use of pull-up resistor 214 utilized by a logic control circuit (not shown in FIG. 2) within detection circuit 202 is merely the result of a design choice.

One of skill in the art will appreciate that various other communication methods and components may be used to accomplish the objectives of the present invention. A person of skill in the art will appreciate that system 200 may utilize any type of protection circuitry 212, 216 known in the art, e.g., an overvoltage protection circuit, to protect any part of detection circuit 202 against failures and physical damage.

In embodiments, detection circuit 202 receives a signal, for example an analog audio signal, at interface 248, e.g., via center pin of a coaxial cable. In embodiments, contact 244 (labeled L-DET in FIG. 2) of socket 204 may be coupled to interface 248 via node 236. Contact 244 may be a contact on a detection pin on connector 204.

In embodiments, detection circuit 202 superimposes on a signal at interface 248 a current signal, which may be internally generated by detection circuit 202, to generate an analog voltage that is representative of the impedance between contact 244 of connector 204 and a reference potential (e.g., ground 238). In embodiments, the current signal is injected into node 236, such that the voltage between contact 244 and the reference potential is indicative of the impedance at an electrical signal line that comprises node 236. In embodiments, this analog voltage or the voltage detected at interface 248 may be converted into a digital voltage for further processing. System 200 may use the digital voltage and/or associated impedance information to determine whether connector 204 is electrically connected to detection circuit 202, e.g., at interface 248. System 200 may further determine the presence of humidity, water, etc., which may cause a relatively low impedance, which may be mistaken for the presence of a connection between, e.g., connector 204 and interface 248.

In embodiments, detection circuit 202 may inject, at predetermined times, e.g., at periodic intervals, a current, e.g., a few µA, into node 236. In addition to performing current injection at one or more different times, detection circuit 202 may use different levels of current to increase, for example in predetermined increments, the resolution of a to-be-measured signal at node 236, thereby, increasing the precision of the voltage or impedance reading. In embodiments, the current level may be increased, e.g., in response to determining a relatively low voltage value. It is understood, that any measured values may be processed to increase measurement reliability. In embodiments, current levels and/or periodic intervals are programmed via processor 210.

In embodiments, if a value of a signal of detection circuit 202, such as an ADC or comparator value, is higher than the detection threshold value, e.g., due to the presence of an external audio signal generated on contact 244, the impedance may not be accurately detected due to the superposition of the signals. Therefore, in embodiments, the presence of a zero-crossing of the signal at contact 244 (e.g., audio signal) may be used as an indicator to reliably detect the presence of an external signal at contact 244. In embodiments, if it is determined, for example during a predetermined detection time period, that an external signal is present, an impedance or ADC value measured by detection circuit 202 may be discarded as potentially faulty and, thus, invalidating the impedance detection result.

In embodiments, even if it is determined that an external signal is present at detection circuit 202, if the ADC/impedance measurement of detection circuit 202 indicates a relatively low impedance, the impedance detection decision may be accepted as valid.

For example, if an audio signal is present at node 236, but that signal has such a low voltage that a device detection threshold of detection circuit 202 is not exceeded, that the signal at node 236 may still serve as an indicator for the presence of connector 204, irrespective of the simultaneous presence of the audio signal and the measurement signal. In embodiments, once detection circuit 202 completes a detection, a zero-crossing counter (not shown) may be reset in preparation for another measurement in a subsequent time period.

In embodiments, processor 210 receives input signal 242 that indicates an attachment condition of connector 204 and, in response, acts on the input signal, for example by initiating a halt of data being processed by audio codec 208 or music being played, and the like.

Figure 3:
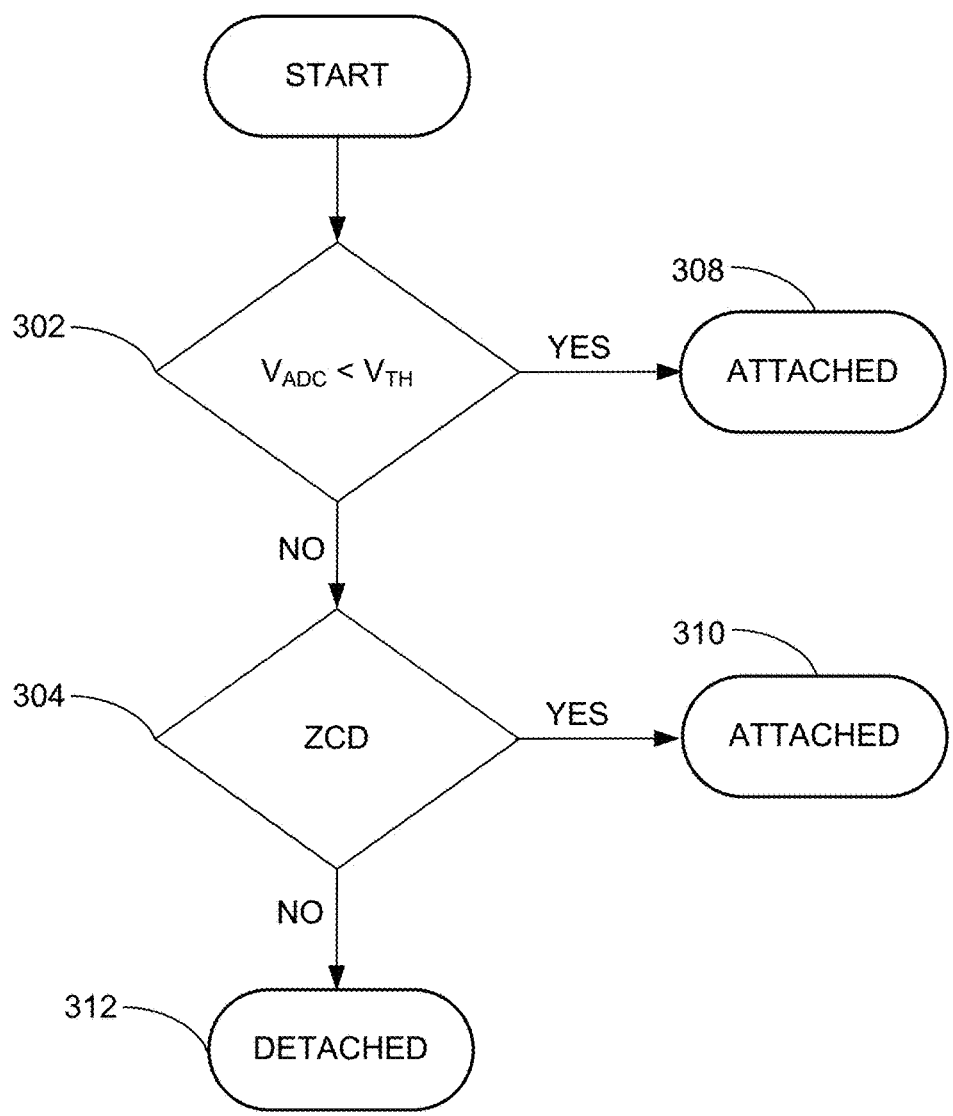
FIG. 3 is a flowchart illustrating a decision tree as used by the detection circuit shown in FIG. 1.

FIG. 3 is a flowchart illustrating a decision tree for a process that may be used by the detection circuit shown in FIG. 1, for example, to reliably detect the presence or absence of an accessory at the detection circuit.

In embodiments, process 300 begins at step 302 when it is determined whether a measured or calculated ADC voltage, $V_{ADC}$, exceeds a predetermine threshold voltage, $V_{TH}$. If so, process 300 determines, at step 304, whether the ADC voltage satisfies a zero-crossing condition, for example, within some predetermined time period. If so, then at step 310, process 300 concludes that the accessory is, in fact, attached to the detection circuit.

Conversely, if at step 304, it is determined that the ADC voltage does not satisfy the zero-crossing condition, process 300 concludes that the accessory is not attached to the detection circuit.

If, at step 302, it is determined that the voltage $V_{ADC}$ does not exceed the threshold voltage $V_{TH}$, then process 300 determines, at step 308, that the accessory is attached to the detection circuit.

It is noted that the latter scenario includes cases in which no external (e.g., audio) signals are present at the detection circuit to interfere with the detection circuit in a manner that may, otherwise, cause erroneous measurement results, e.g., in voltage $V_{ADC}$. Measuring or deriving impedance(s) under those scenarios is rather straightforward. It is further noted that detection circuit may use process 300 at predetermined time periods, which, for example, may have arbitrary length.

Figure 4:
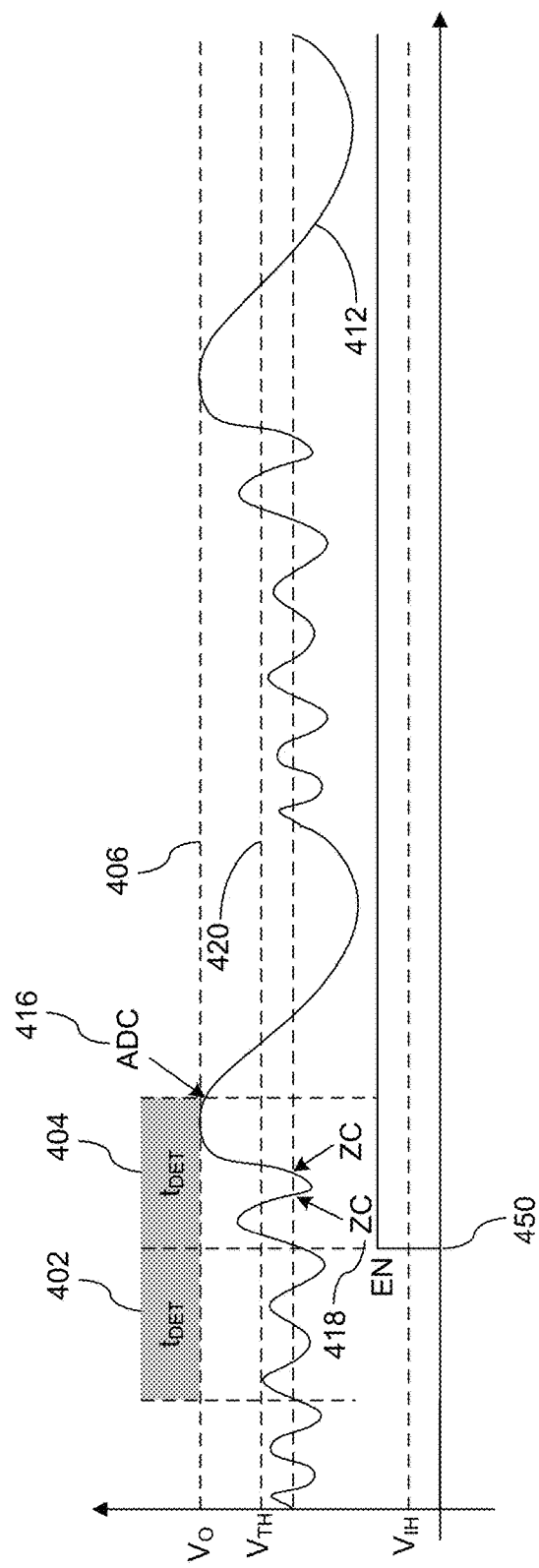
FIG. 4 is a graph illustrating a voltage waveform at a detection circuit according to embodiments of the current disclosure.

FIG. 4 is a graph illustrating a voltage waveform at a detection circuit according to embodiments of the current disclosure. Graph 400 depicts, analog signal 412, enable signal 450, open circuit voltage $V_O$, threshold voltage $V_{TH}$, and time interval 402, 404. In embodiments, enable signal 450 enables detection, e.g., within an impedance detection period, e.g., an on-time of the detection circuit, corresponding to time interval 402, 404. $V_{TH}$ refers to an accessory detection threshold, e.g., within the impedance detection period. Analog signal 412 (e.g., audio) may be any arbitrary voltage waveform that comprises one or more signals, and may be obtained, e.g., by employing a peak detector within the detection circuit.

In embodiments, time interval 402 may be associated with a first current that is lower than a second current associated with time interval 404. The relatively higher second current may be used to increase the voltage at signal line, e.g., to increase the resolution of a measurement.

In embodiments, ADC value 416 may be determined by converting analog signal 412 into a digital signal using any method known in the art. It is understood that any analog signal 412 may undergo any type of pre-processing or post-processing, e.g., averaging of measured values, etc. In embodiments, ADC detection 416 is performed at or near the end of time period 402, 404 to enable the capturing of zero-crossing events 418 of analog signal 412 that occur relatively late in time period 402, 404. In embodiments, once ADC detection has been performed, a detection circuit may reset ADC value 416, e.g., in preparation for a later detection at a subsequent time period.

It is understood that time interval 402, 404 should be chosen sufficiently long, such that at least one zero-crossing of analog signal 412 can be detected during the on-time of the detection circuit.

Figure 5:
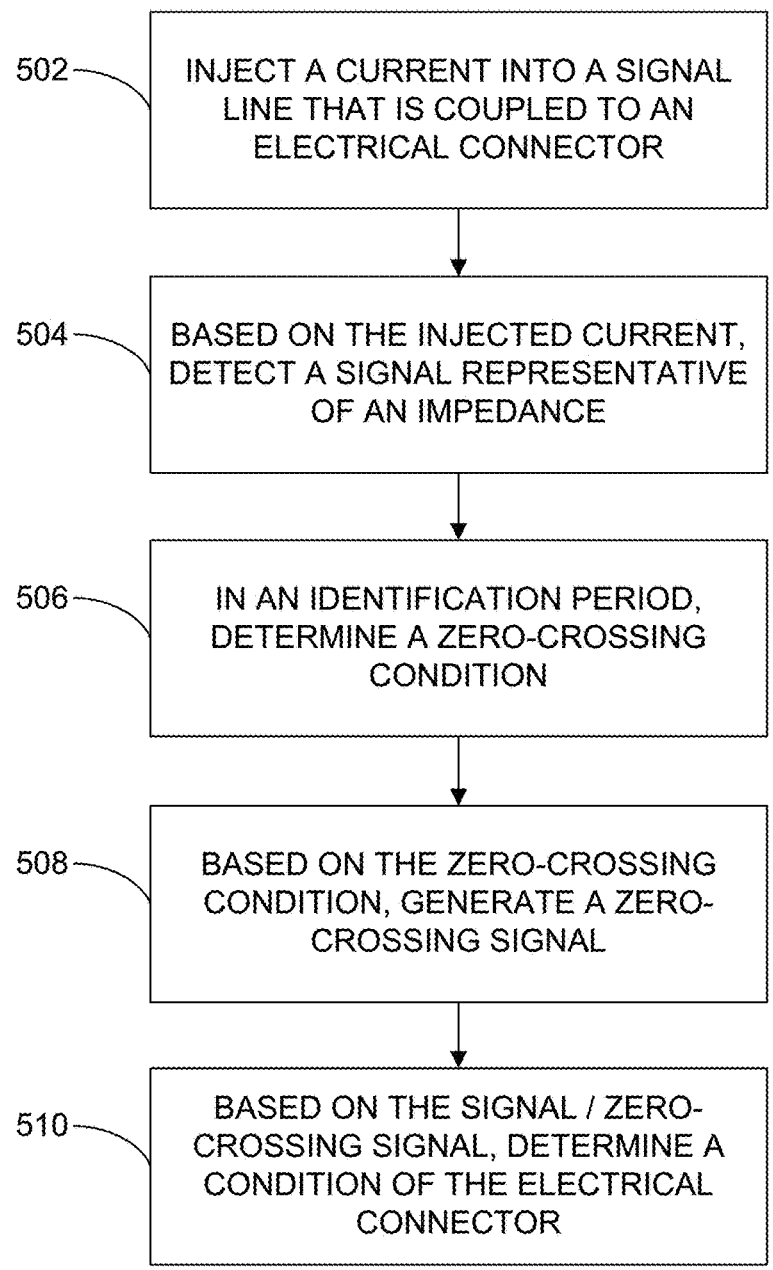
FIG. 5 is a flowchart illustrating a process for reliably detecting of the presence of an accessory according to embodiments of the current disclosure.

FIG. 5 is a flowchart illustrating a process for reliably detecting of the presence of an accessory according to embodiments of the current disclosure. In embodiments, process 500 begins at step 502 by injecting a current, e.g., via a constant current source, into a signal line, e.g., at a pin that is coupled to an electrical connector.

At step 504, based on the injected current a first signal is detected. That signal may be representative of the impedance between the pin and a reference potential, e.g., a ground potential.

At step 506, a zero-crossing condition is determined, for example, in a predetermined identification interval.

At step 508, based on the zero-crossing condition, a second signal—a zero-crossing signal—is generated, e.g., by a zero-crossing detector.

Finally, at step 510, based on the first and/or the second signal, a condition of the electrical connector is determined, for example, by using the decision tree illustrated in FIG. 3. For purposes of brevity, the steps for using the decision tree are not repeated here.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A detection circuit for reliably detecting of the presence of an accessory, the detection circuit comprising:
    an interface to receive a current and a signal that is representative of an impedance between a pin and a reference potential;
    a current source that generates the current;
    a zero-crossing detector coupled to the current source, the zero-crossing detector generates a zero-crossing signal in response to determining, within an identification period, whether the signal satisfies a zero-crossing condition;
    an ADC coupled to the current source, the ADC detects the signal based on the current; and
    a controller coupled to the ADC and the zero-crossing detector, the controller determines, in response to the signal satisfying the zero-crossing condition and not exceeding a threshold voltage, the presence of the accessory at the detection circuit.

2. The detection circuit claim 1, wherein the signal is a voltage signal.

3. The detection circuit claim 1, wherein the signal comprises an audio signal.

4. The detection circuit claim 1, wherein the signal indicates the presence of a contamination.

5. The detection circuit according claim 1, wherein the zero-crossing detector is a programmable hysteresis detector.

6. The detection circuit according claim 1, wherein the controller comprises a logic control circuit.

7. The detection circuit according claim 6, wherein the logic control circuit comprises a state machine.

8. The detection circuit according claim 1, wherein the condition of the electrical connector indicates that an accessory has been removed from the interface.

9. The detection circuit according to claim 1, wherein the detection circuit is implemented in a portable device.

10. A method for reliably detecting of the presence of an accessory in an audio system, the method comprising:
    injecting a current into a signal line coupled to an electrical connector;
    based on the current, detecting a signal representative of an impedance associated with the signal line and a reference potential;

in an identification period, generating a zero-crossing signal;

determining whether the signal satisfies a zero-crossing condition; and in response to the signal satisfying the zero-crossing condition and not exceeding a threshold voltage, determining the presence of the accessory at the detection circuit.

11. The method according to claim 10, wherein the signal is a voltage signal.

12. The method according to claim 10, further comprising using the zero-crossing signal to detect a second signal.

13. The method according to claim 12, wherein the second signal is an audio signal.

14. The method according to claim 10, further comprising, prior to generating the zero-crossing signal, determining, based on the signal, an initial condition of the electrical connector.

15. The method according to claim 10, wherein the condition of the electrical connector indicates the presence of a contamination.

16. A system for reliably detecting of the presence of an accessory in an audio system, the system comprising:

an interface designed to receive a test signal and a voltage that is representative of an impedance between a pin and a reference potential;

a detection circuit coupled to the interface, the detection circuit comprising:
  a test signal generator that generates the test signal;
  a zero-crossing detector coupled to the test signal generator, the zero-crossing detector determines, within an identification period, whether the voltage satisfies a zero-crossing condition, the zero-crossing detector outputs a zero-crossing signal;
  an ADC coupled to a current source, the ADC detects the voltage based on the test signal;
  a controller coupled to the ADC and the zero-crossing detector, the controller determines, in response to the signal satisfying the zero-crossing condition and not exceeding a threshold voltage, the presence of the accessory at the detection circuit; and
a processor coupled to the detection circuit, the processor determines the identification period.

17. The system according to claim 16, wherein the detection circuit is implemented in a portable device.

18. The system according to claim 16, wherein the zero-crossing detector is a programmable hysteresis detector.

19. The system according to claim 16, wherein the condition of the electrical connector indicated the presence of a device at the interface.

20. The system according claim 16, wherein the controller comprises a logic control circuit that comprises a state machine.

* * * * *